US009490766B2

(12) United States Patent
Kisner et al.

(10) Patent No.: US 9,490,766 B2
(45) Date of Patent: Nov. 8, 2016

(54) SHIELDED MULTI-STAGE EMI NOISE FILTER

(71) Applicant: UT-Battelle, LLC, Oak Ridge, TN (US)

(72) Inventors: Roger Allen Kisner, Knoxville, TN (US); David Lee Fugate, Lenoir City, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 177 days.

(21) Appl. No.: 14/180,119

(22) Filed: Feb. 13, 2014

(65) Prior Publication Data
US 2015/0229288 A1   Aug. 13, 2015

(51) Int. Cl.
*H03H 7/01*   (2006.01)
*H03H 1/00*   (2006.01)
*H05K 1/02*   (2006.01)
*H05K 3/00*   (2006.01)

(52) U.S. Cl.
CPC .......... *H03H 1/0007* (2013.01); *H03H 7/0115* (2013.01); *H03H 2001/0021* (2013.01); *H03H 2001/0028* (2013.01); *H05K 1/0209* (2013.01); *H05K 1/0233* (2013.01); *H05K 3/0061* (2013.01); *H05K 2201/09972* (2013.01); *H05K 2201/1006* (2013.01); *H05K 2201/10219* (2013.01)

(58) Field of Classification Search
CPC ............. H03H 7/0115; H03H 1/0007; H03H 2001/0021; H03H 2001/0028
USPC .................................. 333/4, 5, 12, 181, 185
See application file for complete search history.

(56) References Cited

U.S. PATENT DOCUMENTS

| | | | | |
|---|---|---|---|---|
| 4,021,759 A | * | 5/1977 | Campi | H02H 9/005 333/17.2 |
| 4,672,337 A | * | 6/1987 | Thibeault | H03H 1/0007 333/12 |
| 4,884,171 A | * | 11/1989 | Maserang | G01R 1/18 174/357 |
| 5,432,488 A | * | 7/1995 | Kotani | H05K 5/064 333/167 |
| 6,229,442 B1 | * | 5/2001 | Rolin | G06K 7/10336 340/572.1 |
| 6,402,369 B1 | * | 6/2002 | Ludington | G01N 25/4866 136/204 |
| 2005/0061528 A1 | * | 3/2005 | Bayar | H05K 9/0056 174/51 |
| 2010/0061509 A1 | * | 3/2010 | D'Ambrosio | A61B 6/10 378/62 |
| 2011/0058809 A1 | * | 3/2011 | Lagorsse | H01P 1/2138 398/43 |
| 2014/0091874 A1 | * | 4/2014 | Cook | H01P 1/203 333/12 |
| 2014/0266507 A1 | * | 9/2014 | Fauer | H02M 1/10 333/181 |
| 2015/0288043 A1 | * | 10/2015 | Buchauer | H01P 1/205 333/207 |

* cited by examiner

*Primary Examiner* — Robert Pascal
*Assistant Examiner* — Rakesh Patel
(74) *Attorney, Agent, or Firm* — Klarquist Sparkman, LLP

(57) ABSTRACT

Electromagnetic interference (EMI) noise filter embodiments and methods for filtering are provided herein. EMI noise filters include multiple signal exclusion enclosures. The multiple signal exclusion enclosures contain filter circuit stages. The signal exclusion enclosures can attenuate noise generated external to the enclosures and/or isolate noise currents generated by the corresponding filter circuits within the enclosures. In certain embodiments, an output of one filter circuit stage is connected to an input of the next filter circuit stage. The multiple signal exclusion enclosures can be chambers formed using conductive partitions to divide an outer signal exclusion enclosure. EMI noise filters can also include mechanisms to maintain the components of the filter circuit stages at a consistent temperature. For example, a metal base plate can distribute heat among filter components, and an insulating material can be positioned inside signal exclusion enclosures.

20 Claims, 10 Drawing Sheets

SHIELDED MULTI-STAGE EMI NOISE FILTER

ACKNOWLEDGMENT OF GOVERNMENT SUPPORT

This invention was made with government support under Contract No. DE-AC05-00OR22725 awarded by the U.S. Department of Energy. The government has certain rights in the invention.

BACKGROUND

Measurement of electrical and electromagnetic signals often involves distinguishing a target signal from noise. For devices that generate low output voltages, noise can easily overwhelm the target signal. Thermocouples, which are commonly used for temperature measurement in industry, often have output voltages in the millivolt range.

Thermocouples are sometimes used in electrically noisy environments, such as in the presence of induction heating supplies, that cause electromagnetic interference (EMI) noise to appear along with the thermocouple signal. The conventional approach for overcoming the problems caused by electrically noisy environments is to simply avoid making measurements in these environments. For example, induction heating supplies are typically turned off prior to making a thermocouple measurement.

SUMMARY

Using the electromagnetic interference (EMI) noise filters and methods of filtering EMI noise described herein, low output voltages can be measured in high noise environments. For example, low voltage signals at low frequencies can be measured despite high levels of higher frequency noise. An EMI noise filter can include multiple signal exclusion enclosures. A first signal exclusion enclosure can contain a first stage filter circuit. A second signal exclusion enclosure can contain a second stage filter circuit. The first and second signal exclusion enclosures can attenuate noise generated external to the respective enclosures and isolate noise currents generated by the corresponding filter circuits. Signal exclusion enclosures can be, for example, Faraday cages. Depending upon the amount of filtering desired for a particular implementation, additional signal exclusion enclosures and filter circuit stages are added to achieve the desired filtering.

The input to the noise filter can be a differential input such as a thermocouple input. An output of the first stage filter circuit can be connected to an input of the second stage filter circuit. The first and second stage filter circuits can each include at least one inductor and at least one capacitor. The first and second signal exclusion enclosures can be chambers formed at least in part by an outer signal exclusion enclosure. A noise filter can include mechanisms to maintain the components of the filter circuit stages at a consistent temperature. For example, a metal base plate can distribute heat among the components, and an insulating material can be positioned inside signal exclusion enclosures.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The foregoing and other objects, features, and advantages of the claimed subject matter will become more apparent from the following detailed description, which proceeds with reference to the accompanying figures.

DETAILED DESCRIPTION

Examples described herein provide electromagnetic interference (EMI) noise filters and methods for filtering EMI noise. Such filters can, for example, be used with thermocouples in locations that are subject to high intensity alternating current (AC) magnetic fields. These AC fields can induce voltages on thermocouples that cause measurement anomalies. Induced voltages can be especially problematic for low output voltage devices, such as type S, R, and B thermocouples. For example, measurements made using a type S thermocouple in close proximity to a high-frequency induction heater can be rendered unreliable due to voltage induced by the induction heater.

Various examples described herein filter using passive electrical components such as inductors and capacitors housed in a multi-chambered signal exclusion enclosure (or separate exclusion enclosures) to limit propagation of magnetic and electrical fields from one filter stage to another that can otherwise thwart the attenuating capability of the filter networks. In some examples, the physical design of the multi-chambered enclosure limits temperature gradients developed across the electrical components of the filter stages. Temperature gradients can cause a bias to develop because of the "phantom" thermocouple junctions created by dissimilar metals in the signal path. Example filters can be used to filter both thermocouple and non-thermocouple signals as well as for power supply filtering. Examples are described in detail below with reference to FIGS. 1-10.

EMI Noise Filter Examples

Figure 1:
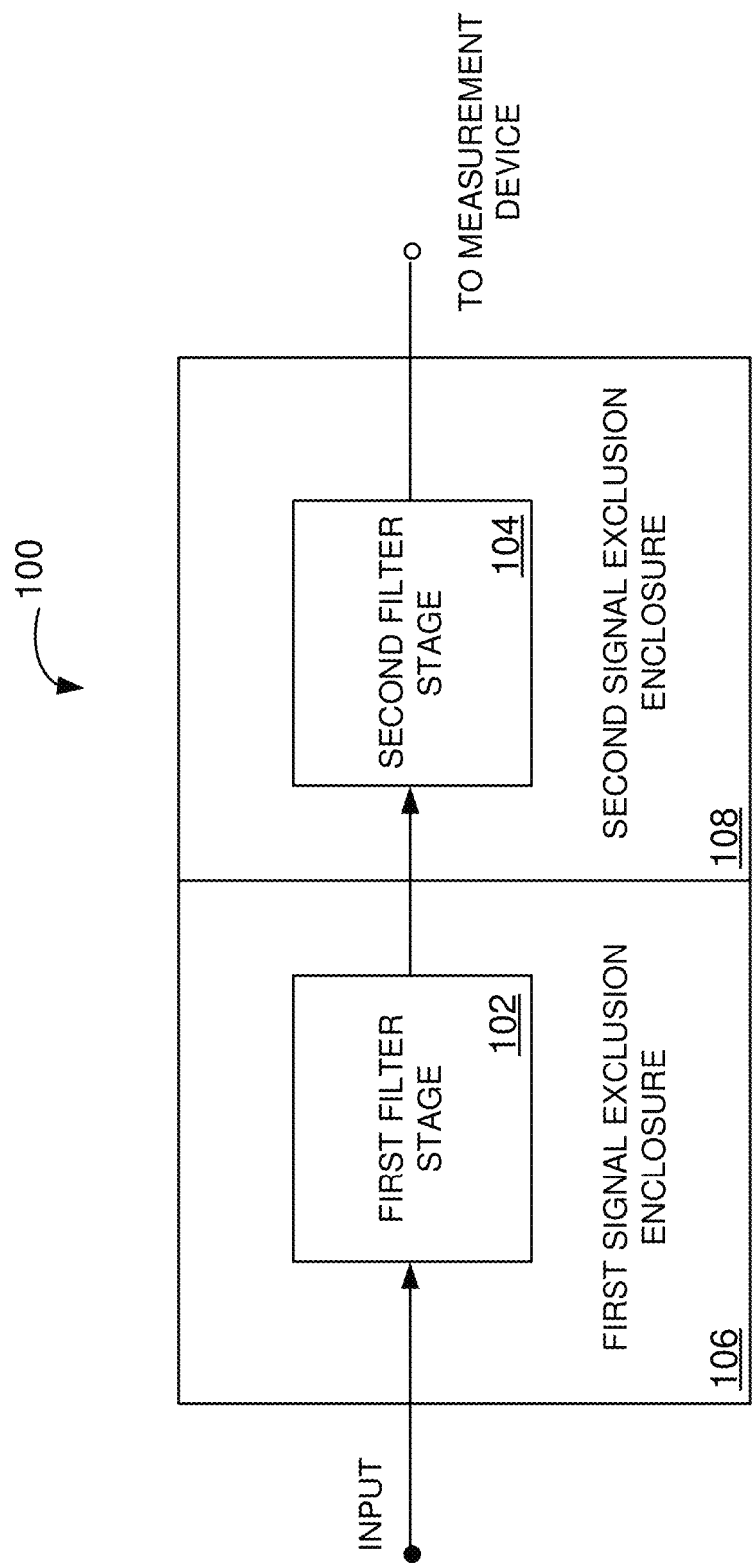
FIG. 1 is a block diagram of an example EMI noise filter.

FIG. 1 illustrates an example EMI noise filter 100. A first stage filter circuit 102 receives an input signal. The input signal can be, for example, a low-voltage input signal. An output of a first stage filter circuit 102 is connected to an input of second stage filter circuit 104. In some examples, "connected" means that the output of first stage filter circuit 102 is directly connected to the input of second stage filter circuit 104 without other intermediate stages such as additional filtering or signal conditioning (with the exception of passing through feed-through capacitors, cables, couplers, or similar communication structures). Such a connection can also be referred to as "cascading." An output of second stage filter circuit 104 is provided to a measurement device. In some examples, one or more additional filter circuit stages are used prior to providing the output to a measurement device. First filter stage circuit 102 is contained within a first signal exclusion enclosure 106, and second filter stage circuit 104 is contained within a second signal exclusion enclosure 108.

As used herein, a "signal exclusion enclosure" is an enclosure that attenuates a signal generated outside of the enclosure such that the magnitude or other characteristic of the external signal detected inside the enclosure is reduced by a substantial amount. Signal exclusion enclosures can be designed to provide a level of attenuation desired for a particular application. For example, signal exclusion enclosures can provide 60 dB, 90 dB, or 150 dB of attenuation. The amount of external electromagnetic signal that is attenuated by a signal exclusion enclosure varies depending on a variety of factors including wall thickness, materials of construction, and the frequency of the external signal. In some signal exclusion enclosures, more of the attenuation of the external signal is provided by attenuating the magnetic field component of the signal rather than the electric field component. The magnetic field component is related to skin depth or the physical depth of electrical current in the material; typically, the better the conductor a material is, the better the magnetic field attenuation is.

An example of a signal exclusion enclosure is a "Faraday cage," which is an enclosure typically having a solid conductor layer or a layer of interconnected conductive elements such as a metal mesh. The conductive nature of the Faraday cage shields the volume enclosed by the Faraday cage from electromagnetic radiation originating outside of the cage. Signal exclusion enclosures can also be other types of enclosure that may not be strictly considered to be a Faraday cage. For example, portions of the enclosure may be missing, have gaps, incorporate non-conductive materials, etc. Different portions of signal exclusion enclosures can comprise different materials. Signal exclusion enclosures can also be referred to as "shielded" enclosures.

Throughout this document, lists of alternatives are presented. This does not imply that all alternatives are equally desirable or offer equal performance. For example, different enclosure types can be used and different materials can be used to create enclosures, but some enclosure types and materials provide different characteristics and advantages under various circumstances and are not necessarily equal alternatives.

In FIG. 1, signal exclusion enclosures 106 and 108 are shown having a partially common boundary. In some examples, discrete signal exclusion enclosures are physically connected together. For example, multiple signal exclusion enclosures can be welded or screwed together or pressure fit with brackets or other support structure. In some examples, signal exclusion enclosures are defined by partitioning an enclosure. For example, a conductive partition (e.g. a copper plate) can be placed inside a pre-manufactured signal exclusion enclosure (e.g. an aluminum enclosure) to form two signal exclusion chambers. In other examples, separate exclusion enclosures are connected by shielded wires that communicate signals between enclosures.

First stage filter circuit 102 and second stage filter circuit 104 can incorporate high-pass filters, low-pass filters, band-pass filters, or other known filter types. In some examples, only passive components such as resistors, inductors, and capacitors are used to create the filters. The types of filters used and the frequencies at which the filters operate (determined by component values) can be designed to meet the requirements of expected use. In one example, first stage filter circuit 102 and second stage filter circuit 104 each include an "LC" low-pass filter. LC low-pass filters can be formed by placing an inductor (L) in series with the input path followed by a capacitor (C) in parallel (connected between the output of the inductor and ground). In some examples, a resistor can be used in place of or in addition to an inductor. Other low-pass filter configurations are also possible.

Figure 2:
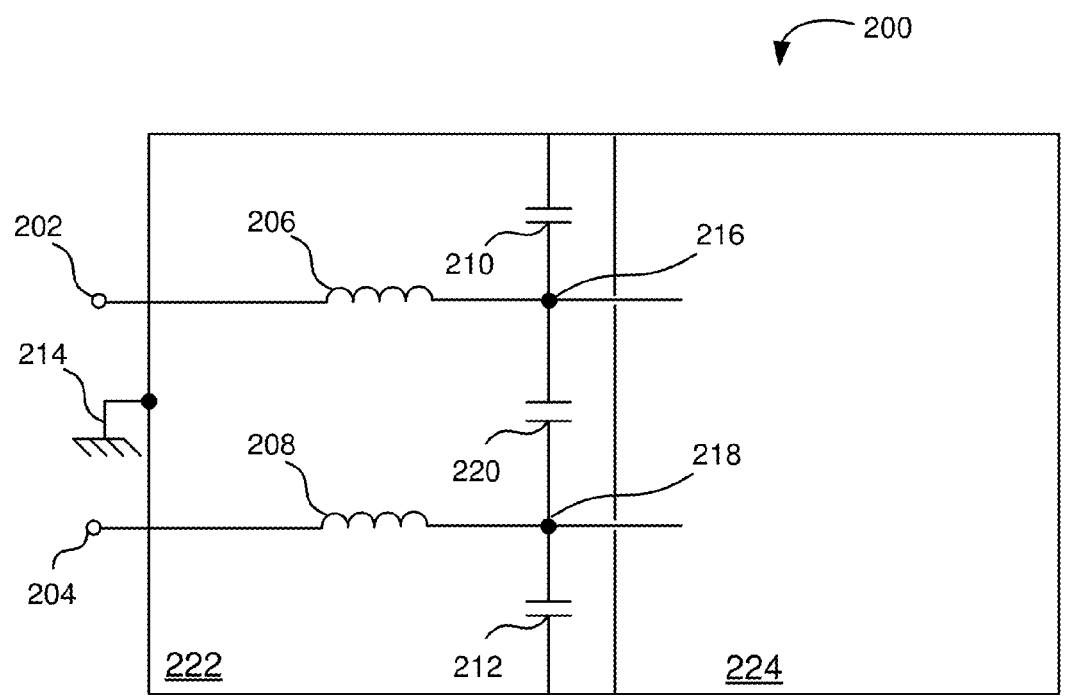
FIG. 2 is a partial block diagram of an example EMI noise filter having a differential input and a first stage filter circuit using low-pass filters.

FIG. 2 illustrates an example EMI noise filter 200. Filter 200 has two inputs, input 202 and input 204. Inputs 202 and 204 may be a differential signal pair. In some examples, input 202 is a positive input, and input 204 is a negative input (or vice-versa). A thermocouple, for example, provides a differential signal pair as output—the voltage across each of two conductors. Inductor 206 is in series with input 202, and inductor 208 is in series with input 204. Capacitors 210 and 212 are connected between ground 214, and inductors 206 and 208, respectively. Inductor 206 and capacitor 210 form a first low-pass filter, with a first filtered output at node 216. Inductor 208 and capacitor 212 form a second low-pass filter, with a second filtered output at node 218. The first and second filtered outputs form a filtered first stage output signal pair. Capacitor 220 provides a return path for differential mode currents. The filtered first stage output signal pair is provided to the next filter stage (not shown for clarity). Capacitors 210, 212, and 220 and inductors 206 and 208 form a first stage filter circuit and are contained within a first signal exclusion enclosure 222. Additional components, including additional filtering capacitors, may also be included. In some examples, multiple series inductors are used in place of a single inductor, and multiple parallel capacitors are used in place of a single capacitor. Second signal exclusion enclosure 224 is shown, but the second stage filter circuit has been omitted. Although non-polarized capacitors are shown in FIG. 2, polarized capacitors can also be used. Polarized capacitors, however, can have substantial leakage current (resulting in noise) and significant series inductance at high frequencies.

Figure 3:
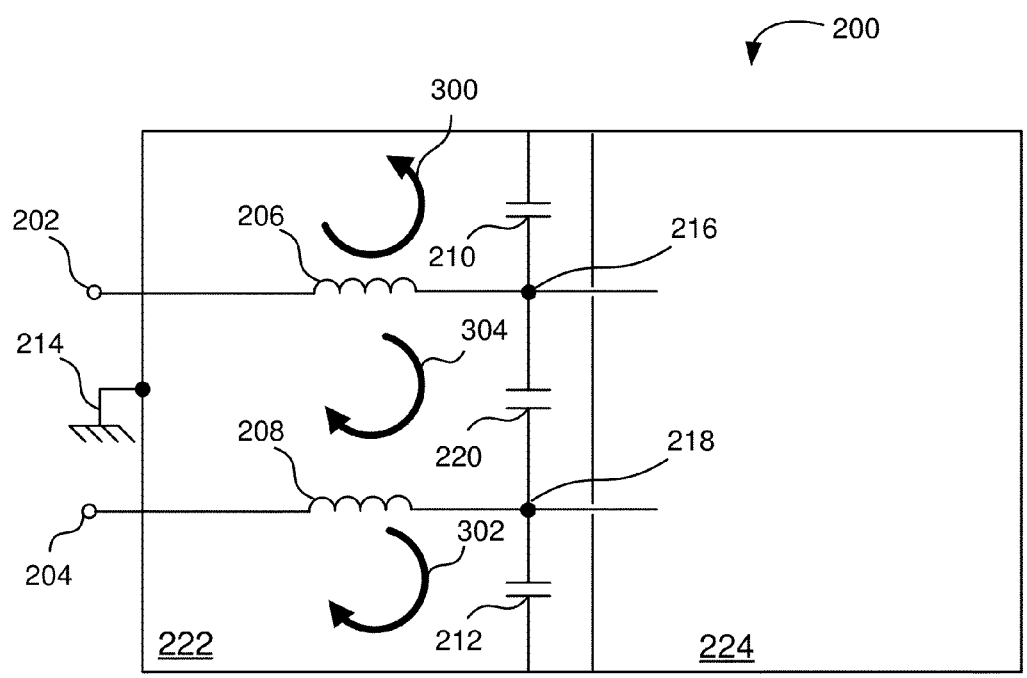
FIG. 3 is a block diagram illustrating the flow of common-mode and differential-mode currents in the block diagram of FIG. 2.

FIG. 3 illustrates the flow and isolation of noise currents in the example EMI noise filter 200 of FIG. 2. Common mode noise current 300 flows from inductor 206, through capacitor 210, to ground 214. Common mode noise current 302 flows from inductor 208, through capacitor 212, to ground 214. Differential mode noise current 304 flows from inductor 206, through capacitor 220, and inductor 208. Capacitors act as open circuits at DC and exhibit low impedance at higher frequencies, thus removing high-frequency noise without impacting the primarily DC or low-frequency desirable signal components at nodes 216 and 218. As illustrated in FIG. 3, noise currents generated by the first stage filter circuit components (capacitors 210, 212, and 220 and inductors 206 and 208) contained within first signal exclusion enclosure 222 are isolated within first signal exclusion enclosure 222.

As used herein "isolating" a signal in an enclosure refers to containing or attenuating a signal (e.g., a signal generated by a filter stage within a signal exclusion enclosure) such that the portion of the signal escaping the enclosure has a magnitude (e.g. a sufficiently low magnitude) or other characteristic that does not interfere with a desired signal. The level of attenuation considered to be isolating can vary depending on the application and design of an EMI noise filter. In some examples, isolation is at least 50 dB, 60 dB, 90 dB, 100 dB, or 120 dB attenuation. Isolation does not require 100% attenuation of a signal within an enclosure.

Figure 4:
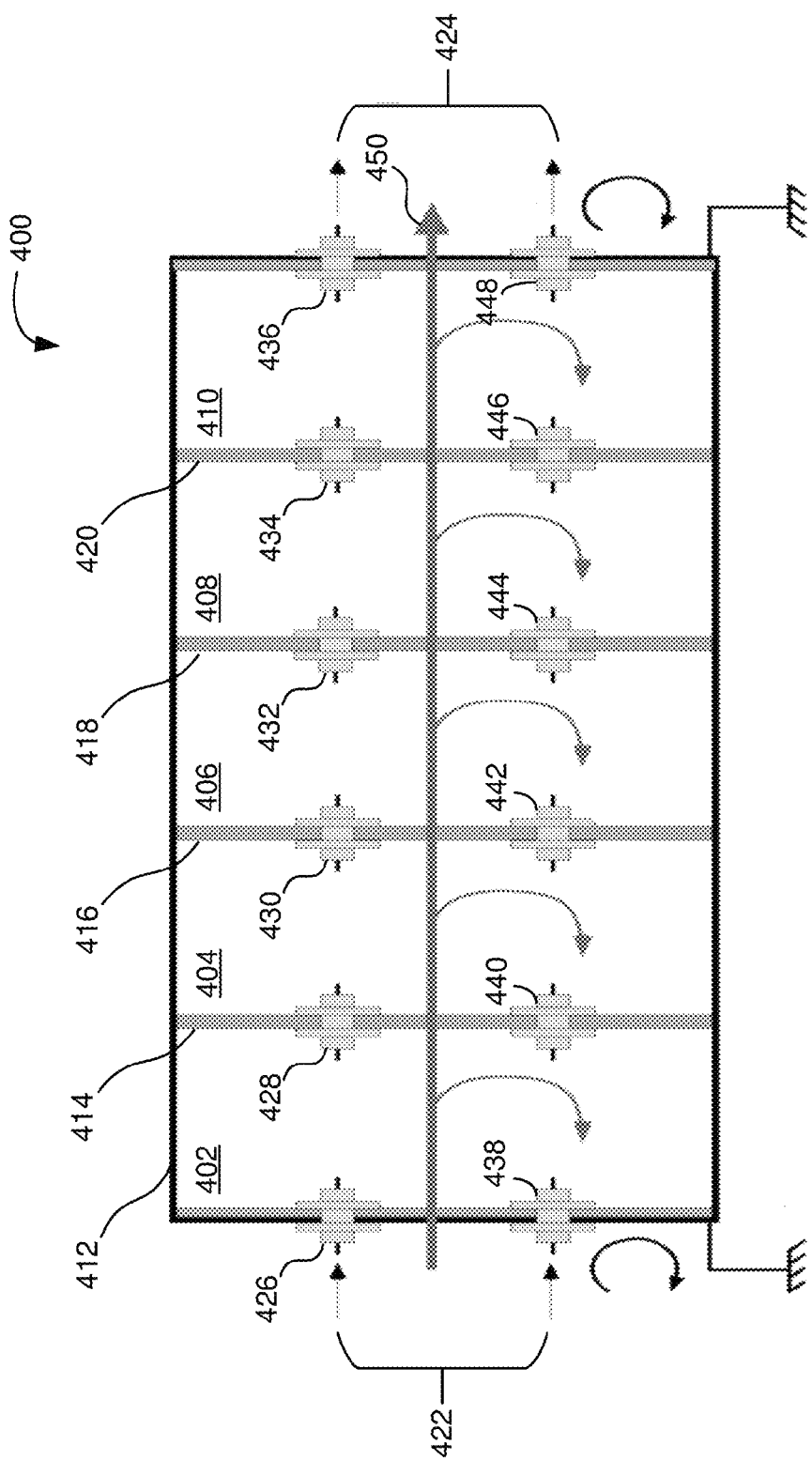
FIG. 4 is a block diagram illustrating portions of an example EMI noise filter having five signal exclusion enclosures.

FIG. 4 illustrates an example EMI noise filter 400 having five signal exclusion enclosures 402, 404, 406, 408, and 410. In FIG. 4, an outer signal exclusion enclosure 412 has been divided into enclosures (or "chambers") 402, 404, 406, 408, and 410 by conductive partitions 414, 416, 418, and 420. The filtering circuitry has been omitted from each of enclosures 402, 404, 406, 408, and 410 for clarity. Filter 400 receives a differential signal pair input 422 and outputs a filtered differential signal pair output 424. Signal couplers 426, 428, 430, 432, 434, 436, 438, 440, 442, 444, 446, and 448 pass the output of each stage to the input of the following stage (or to the output, in the case of couplers 436 and 448). The signal couplers can be, for example, feed-through capacitors. As shown by arrow 450, the DC component of differential signal pair input 422 passes through the filter stages contained within enclosures 402, 404, 406, 408, and 410, while high-frequency (AC) components are isolated in the respective enclosures.

Figure 5:
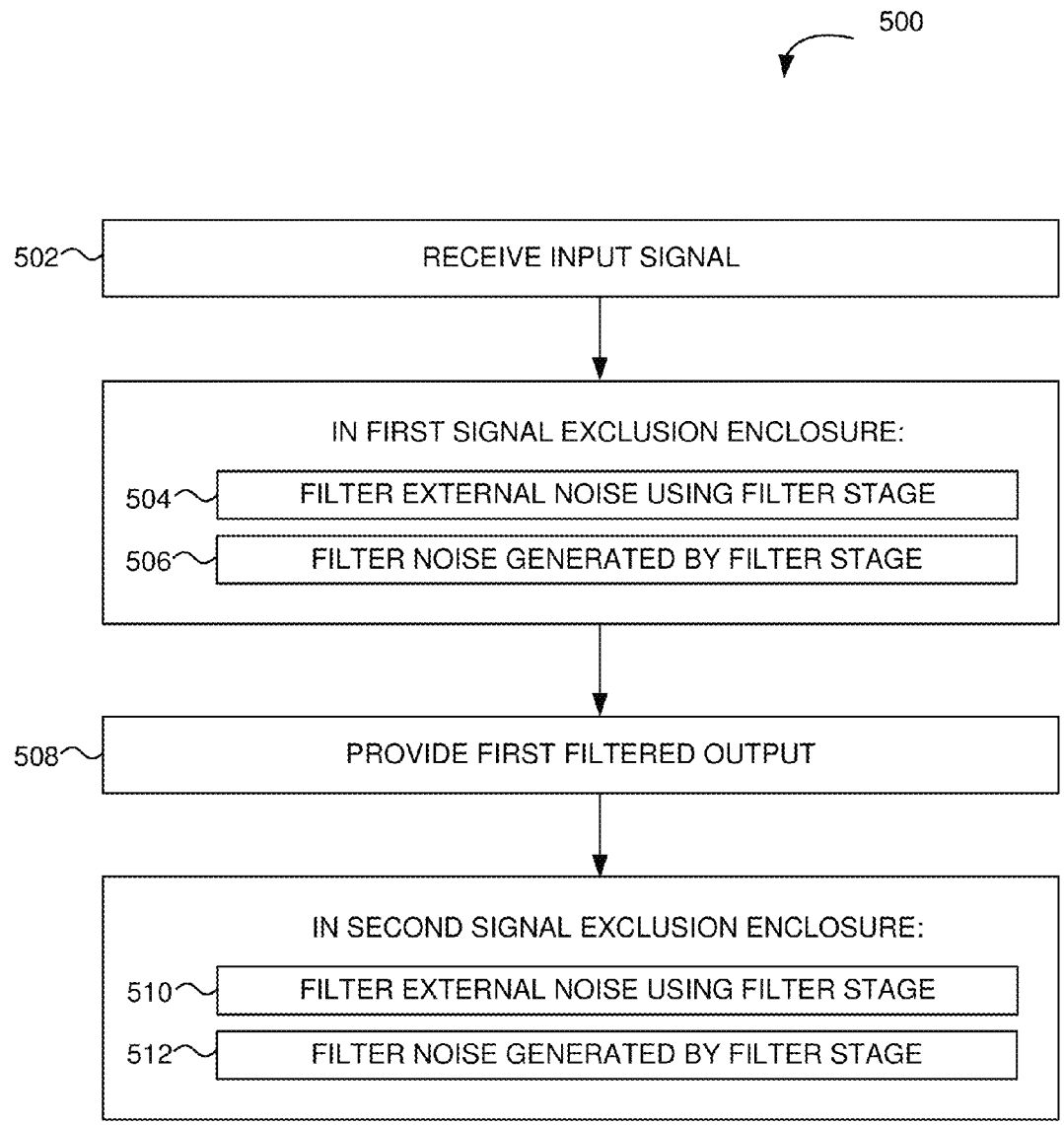
FIG. 5 is a flowchart of an example method for filtering EMI noise.

FIG. 5 illustrates an example method 500 of filtering EMI noise. In process block 502, an input signal is received. In process block 504, external noise is filtered using a first filter stage. Noise generated by the first filter stage is filtered in process block 506. Process blocks 504 and 506 are performed in a first signal exclusion enclosure. In process block 508, a first filtered output is provided to a second filter stage. External noise is filtered in process block 510 using a second filter stage. In process block 512, noise generated by the second filter stage is filtered. Process blocks 510 and 512 are performed in a second signal exclusion enclosure. Additional process blocks representing additional filtering stages may also be included in method 500.

Figure 6:
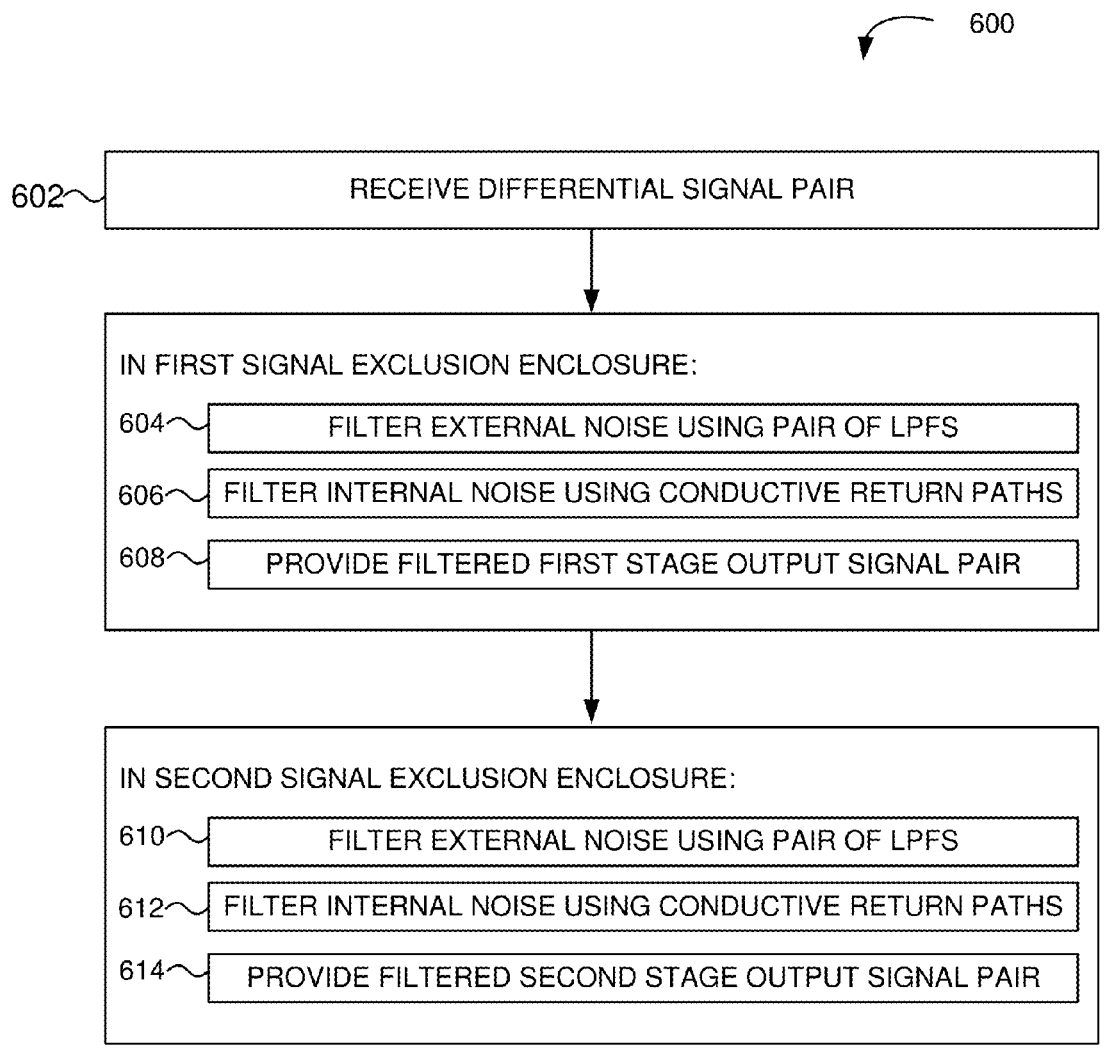
FIG. 6 is a flowchart of an example method for filtering EMI noise for a differential input signal.

FIG. 6 illustrates an example method 600 of filtering EMI noise from a differential signal pair input. In process block 602, a first input signal and a second input signal forming a differential signal pair are received. The differential signal pair input can be, for example, a thermocouple output. Noise generated external to a first signal exclusion enclosure is filtered from the differential signal pair using a corresponding pair of low-pass filters in process block 604. In process block 606, noise generated internal to the first signal exclusion enclosure is filtered from outputs of the pair of low-pass filters by providing return paths for noise currents generated by components of the low-pass filters. In process block 608, a filtered first stage output signal pair is provided. Process blocks 604, 606, and 608 are performed in the first signal exclusion enclosure.

Noise generated external to the second signal exclusion enclosure is filtered from the filtered first stage output signal pair using a second corresponding pair of low-pass filters in process block 610. In process block 612, noise generated internal to the second signal exclusion enclosure is filtered from outputs of the second pair of low-pass filters by providing conductive return paths for noise currents generated by components of the second pair of low-pass filters. In process block 614, a filtered second stage output signal pair is provided. Process blocks 610, 612, and 614 are performed in the second signal exclusion enclosure. Additional process blocks representing additional filtering stages may also be included in method 600. In some examples, while the internally and externally generated noise in the first and second signal exclusion enclosures is being filtered in process blocks 604, 606, 610, and 612, heat is distributed among components of the first and second pairs of low-pass filters using a metal base plate.

Thermocouple Examples

Throughout this document, example EMI noise filters are discussed with respect to thermocouples. Thermocouples are widely used for temperature measurement in industry. Varieties of thermocouple types are available to suit specific temperature ranges, as well as chemical and other environments. Thermocouples are based on the Seebeck effect, which is the occurrence of a net source EMF, the absolute Seebeck EMF, between pairs of points in any individual electrically conducting material due to a difference of temperature between the points. While typical thermocouples use two electrical conductors with different thermoelectric coefficients, the Seebeck EMF occurs even without dissimilar materials. The two conductors of a thermocouple are electrically connected at one end, electrically isolated along their length, and connected to a high impedance electrical potential measurement circuit at the other end. The voltage existing across the ends of each conductor represents the sum of the EMFs generated along the conductor. The magnitude and direction depend on the magnitude and direction of the temperature gradient and the material forming the conductor.

Thermocouple voltage is developed over regions with temperature gradients and not necessarily across the thermo-element junction, which merely serves to provide a common reference electrical potential point. The change in electric potential in a material with temperature is known as the Seebeck coefficient expressed in units of volts per Kelvin (V/K). A thermocouple's voltage can thus be obtained by integrating its local Seebeck coefficient (which is itself a weakly varying function of temperature) up one thermo-element leg and back down the other. Typical values of the Seebeck coefficient for commonly used thermocouple materials range from a few microvolts to tens of microvolts per Kelvin.

Many material pairs are in regular use as thermocouples for thermometry. Some pairs are standardized while others are not. The most extensive application data are available for standardized thermocouples. In the United States, eight materials presently are letter-designated: Types B, E, J, K, N, R, S, and T. The standardized EMF characteristics of these letter-designated types are defined exactly by polynomial functions of high degree rather than by tabulated values.

Because the voltage output of a thermocouple is relatively low (millivolts), its measurement is more subject to electrical noise contamination from nearby sources than other sensors. Table 1 compares the output voltages at 400° C. of several standardized thermocouple types. The precious metal thermocouple types (e.g., S, R, and B) are particularly vulnerable to signal noise contamination. These low amplitude signals require higher gain, precision, and stability in the signal amplification electronics. In many applications in which thermocouples are used, the accuracy required is low enough that the thermocouple outputs can be used without filtering for EMI noise. In the few areas in which higher accuracy is needed, measurements are conventionally made when EMI noise is low (e.g., after a source of EMI noise has been turned off).

TABLE 1

Comparison of voltage outputs of several standardized thermocouple types.

| Thermocouple Type | Seebeck Coefficient | Output at 400° C. | Relative Noise Susceptibility |
|---|---|---|---|
| J (Iron-Constantan) | 51 µV/K | 21.8 mV | Low |
| K (Chromel-Alumel) | 40 µV/K | 16.4 mV | Moderate |
| T (Copper-Constantan) | 40 µV/K | 20.9 mV | Low |
| S (Pt 10% Rh—Pt) | 11 µV/K | 3.3 mV | High |
| R (Pt 13% Rh—Pt) | 11 µV/K | 3.4 mV | High |
| B (Pt 30% Rh—Pt 6% Rh) | 8 µV/K | 0.79 mV | Very High |
| N (Nicrosil-Nisil) | 38 µV/K | 13 mV | Moderate |

Thermocouples can be used in various industrial heating processes such as furnace heat treatment, induction heating, thermomechanical and thermomagnetic materials processing. Such processing frequently uses induction-heating power supplies and in some cases in conjunction with ultra-high static magnetic fields (from 1 to 20 Tesla). Materials are heated to high temperatures and quenched or otherwise manipulated to achieve specific crystalline grain structures. In many cases, thermocouples are installed directly on the materials to measure temperature for validation, control, or monitoring. These induction-heating power supplies typically operate with resonant tank power electronic circuits driven by pulse width modulated circuits. Power supplies can range in power capability from kilowatts to hundreds of kilowatts. Typical induction-heating power supply operating frequencies range from 1 kHz to 1 MHz; noise and harmonics can be generated to across the spectrum to tens of megahertz.

Type S and R thermocouples are typically used in these environments because of their high temperature capability and their immunity to shift in effective Seebeck coefficient from the static external magnetic field as well as from the AC field established by the induction coil. As previously noted, these thermocouple types exhibit low Seebeck coefficients, and hence, low voltage outputs and a propensity for poor signal-to-noise ratios. In addition, thermocouple configuration and construction are frequently subject to high mechanical and physical stress imposed by gas or liquid cooling or quench. Thermocouples are sometimes dislodged and placed in a position that intensifies the fundamental (and harmonics) of the induction field. There is also the possibility that a transient voltage surge will occur in the signal that can be damaging to the signal processing and data acquisition hardware. This transient voltage surge can cause permanent damage to components such as field-effect transistors or series resistors in the control or data acquisition electronics.

Electrical noise can be communicated to thermocouples and their associated wiring by at least the following mechanisms. Radiated electromagnetic energy: the magnetic field from the induction coil can be superimposed on the thermocouple and its associated wiring. Therefore, the fundamental induction frequency and a range of harmonics are summed with the millivolt thermocouple signal. Electrical noise communicated directly to the thermocouple and its wiring: heating of parts is actually accomplished by eddy currents generated in the work piece by the AC induction field generated by the induction heater. These eddy currents can become superimposed over the thermocouple's millivolt signal. Power line and ground communicated electrical noise: induction heating power supplies can be intense sources of wide spectrum noise. The noise signals may be present on control wiring, AC power input wiring (e.g., 3 phase 480 VAC), and the system ground connections. Noise on these wires can also be coupled to the thermocouple input electronic circuits.

In addition, analog and digital circuits that are part of thermocouple input electronics are susceptible to electromagnetic interference (EMI), including radiofrequency interference (RFI). This susceptibility is produced when the coupled RF signal is rectified (envelope demodulated) by the non-linear behavior of the semiconductors used in the small signal analog input stages of the electronic system. These circuits present an AM demodulation effect produced by nonlinearity of internal transistors, generating parasitic signals in low-frequency ranges and an undesired offset voltage, which can be in the same band as the thermocouple signals of interest. Such contamination in the frequency band of interest cannot be removed by subsequent software filtering.

The rectification effect can come from at least the following mechanisms. Pull-up devices unique to thermocouple input circuits that force the input high (or low) when the thermocouple is open: these include a variety of components including resistance, capacitance, inductance, and diode devices. Electrostatic discharge (ESD) protection built-in to the input amplifier stages: the breakdown protection devices in the semiconductor device can include the following: thick field oxide (TFO); zener diodes, grounded gate NMOS (ggNMOS); silicon controlled rectifier (SCR); punch-through-induced protection elements (PIPE); low voltage SCR (LVSCR); gate-coupled NMOS (GCNMOS); bimodal SCR; and spark gap. Parasitic diodes that are artifacts of integrated circuit topology: natural diode structures exist in MOS construction that are normally inactive but become active when forward biased. All transistors are a collection of PN junctions, and it can be challenging to keep the junctions isolated.

Thermocouple EMI Noise Filter Examples

EMI noise filters described herein can be designed with the susceptibilities of thermocouples in mind. In various examples, EMI noise filters can be designed to meet some or all of the following specifications: greater than 90 dB rejection at 300 kHz and beyond (greater rejection is better); less than 0.5 degree Celsius offset introduced in measurement (less offset is better); clamping of output voltage to protect data acquisition system (for example, set between 10-80 V); operation in full differential mode (i.e., isolated from ground); and introduction of less than 0.1 degree Celsius (equivalent) of internally generated noise. Other specifications are also possible.

Noise-induced signals on thermocouples in the range of tens of volts are possible from induction heating systems and other high current switching drive systems. EMI noise filters designed to remove this noise can also be designed to avoid developing spurious voltages because of internal thermal gradients across dissimilar metals and to avoid loading or introduce a bias to the thermocouple signal.

As discussed above with reference to FIG. 4, a low-pass filter in series with the thermocouple connections allows near DC thermocouple signals to pass substantially unaffected while removing the higher frequency signals that can interfere with input electronics of the data acquisition or control system. DC power supplies can also be filtered in this way. By using passive components such as resistors, capacitors, and inductors to form the low-pass filter, the inherent susceptibility of semiconductor electronics to high-frequency envelope detection can be avoided.

A series low-pass filter attenuates frequencies above a certain point (noise) determined by the component values of the low-pass filter. The series low-pass filter can also provide a return path for noise-induced currents in the filter elements, which reduces or eliminates the noise currents imposed on the desired signal output. Multiple filter circuit stages that are each contained within separate signal exclusion enclosures as described herein (or separate signal exclusion chambers of a signal exclusion enclosure) can be used to isolate noise currents in the respective signal exclusion enclosures.

The design of return paths can take into account skin effect; sufficient surface area can be provided to keep path resistance low at high frequencies (10 kHz to several MHz). The skin depth, $\delta$ (in $\mu m$), is determined based on resistivity of the conductor, angular frequency of the current, and absolute magnetic permeability of the conductor. Flat plates and Litz wire can be used to maintain a low resistance path at high frequencies. The multi-chamber or multi-enclosure approach of the examples described herein can also address the radiation of electromagnetic signals by circuit components and wiring.

Various examples described herein also address thermal concerns. Conventional electronic devices are typically assembled on a circuit board substrate (e.g., FR-4). The addition of filter components such as inductors, circuit pads, and feed-through capacitors to a circuit board constructed of copper, tin, or lead can create dissimilar metal junctions that become undesired series thermocouples. These dissimilar junctions can behave as inadvertent series "phantom" thermocouples. These phantom junctions can generate bias (offset) voltages that can contaminate the main thermocouple signal and lead to increased temperature measurement uncertainty.

Example filters can reduce or eliminate the effects of phantom junctions through thermal isolation and minimization of thermal gradients across the passive components. Thermal isolation can be accomplished by isolating the circuit enclosure from the circuit substrate. Insulation has a high thermal resistance which impedes the circuit enclosure heat conduction to the internal circuit substrate. Insulating materials such as aerogels and expanded polystyrene can be used. Thermal gradient minimization can be accomplished by employing a circuit substrate that has a very low thermal resistance and that has significant thermal heat capacity. The low thermal resistance limits potential temperature gradients. The significant heat capacity prevents rapid temperature changes in the material which is in effect a slower thermal time constant. A circuit substrate of copper, for example, has both low thermal resistance and a significant thermal heat capacity.

Thermocouples used with high-power induction heaters can become distorted or compromised during cooling, quenching, and part manipulation. In some cases, the thermocouple leads can become dislodged. High-frequency voltages or transient voltage surges can then become imposed on the thermocouple wires. Surges as high as several hundred volts potential are possible for short durations and can damage the filter components (resistors, capacitors, etc.). Some example filters described herein include an overvoltage protection to reduce the chance of such surges damaging the electronics of the input stage of control systems or data acquisition systems that receive thermocouple output signals. Overvoltage protection devices such as neon or other gas lamps provide high resistance, do not provide a substantial leakage current, and do not exhibit nonlinear effects.

As shown in FIGS. 2-3, an LC low-pass filter topology is used in various example EMI noise filters. Resistors can be used in place of or in addition to inductors, but the resistance of resistors forms a voltage divider with the impedance of the input electronics of the thermocouple. Inductors offer considerably less equivalent series resistance than resistors, which therefore reduces the DC error introduced by the voltage divider. In various examples, a combination of resistors, inductors, and capacitors are used.

Figure 7:
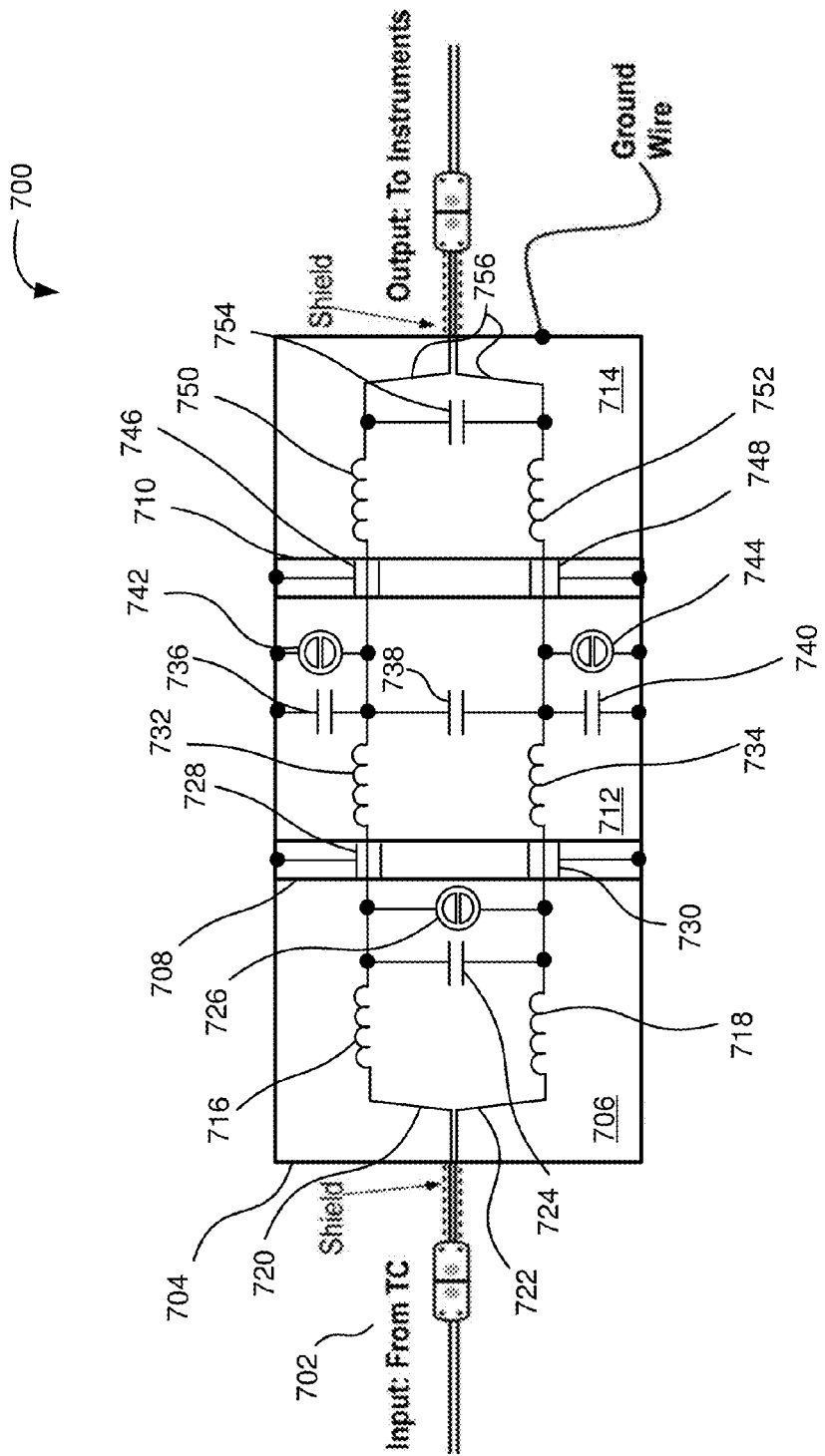
FIG. 7 is a block diagram of an example EMI noise filter having a differential input and three filter circuit stages using low-pass filters.

FIG. 7 illustrates an example EMI noise filter 700. Input 702 comes from a thermocouple and is a differential signal pair input. Input 702 is shielded and passes through an outer signal exclusion enclosure 704 into a first signal exclusion chamber 706. Outer signal exclusion enclosure 704 can be made of a variety of conductive materials. In some examples, outer signal exclusion enclosure 704 is composed primarily or entirely of aluminum. Metal shield plates 708 and 710 (or other conductive partitions) divide outer signal exclusion enclosure 704 into first signal exclusion chamber 706, a second signal exclusion chamber 712, and a third signal exclusion chamber 714. First signal exclusion chamber 706 is thus formed partially by outer signal exclusion enclosure 704 and metal shield plate 708; second signal exclusion chamber 712 is formed partially by outer signal exclusion enclosure 704 and metal shield plates 708 and 710; and third signal exclusion chamber 714 is formed partially by outer signal exclusion enclosure 704 and metal shield plate 710. Metal shield plates 708 and 710 can be made of a number of conductive materials. In some examples, metal shield plates 708 and 710 are made primarily or entirely of copper.

The components within first signal exclusion chamber 704 form a first stage filter circuit; the components within second signal exclusion chamber 712 form a second stage filter circuit; and the components within third signal exclusion chamber 714 form a third stage filter circuit. The first stage filter circuit comprises inductors 716 and 718 in series with the differential signal components 720 and 722, respectively, of thermocouple input 702. Capacitor 724 and neon lamp 726 are placed in parallel between the outputs of inductors 716 and 718. Neon lamp 726 provides overvoltage protection to the other components in the first stage filter circuit. In some examples, the turn-on voltage characteristic of neon lamp 726 is about 70 volts in the dark (incident photons lowers the turn-on voltage). Once ionized, the dynamic resistance of neon lamp 726 drives lamp 726 to about 55 volts. The protection voltage is sufficiently low to protect capacitor 724. In some examples, Zener diodes, avalanche diodes, or other breakdown protection devices are used.

Feed-through capacitors 728 and 730 are connected to ground (grounded outer signal exclusion enclosure 704) and are used to continue the signal paths of differential signal components 720 and 722 from first signal exclusion chamber 704 to second signal exclusion chamber 712 through metal shield plate 708. Feed-through capacitors, such as feed-through capacitors 728 and 730, typically have a housing that fits on and through both sides of a surface, such as metal shield plate 708, to allow a conductor to communicate a signal through the surface. Feed-through capacitors 728 and 730 also form low-pass filters with inductors 716 and 718, respectively. Common mode noise currents can be filtered through feed-through capacitors 728 and 730. Differential noise currents can be filtered through capacitor 724.

The second stage filter circuit within second signal exclusion chamber 712 includes inductors 732 and 734, capacitors 736, 738, and 740, and neon lamps 742 and 744. Similar to the path through metal shield plate 708, feed-through capacitors 746 and 748 are connected to ground and are used to continue the signal paths of differential signal components 720 and 722 from second signal exclusion chamber 712 to third signal exclusion chamber 714 through metal shield plate 710. The third stage filter circuit within third signal exclusion chamber 714 includes inductors 750 and 752 and capacitor 754. A filtered output signal pair 756 is provided to measurement instruments.

Inductors 716, 718, 732, 734, 750, and 752 can be toroidal. Toroid windings exhibit less external stray magnetic field that can couple to nearby components as compared with a straight solenoid-wound inductor. Other inductor styles can also be used such as a C-core or E-core, which can have greater flux leakage compared with a toroid. Additional partitions similar to metal shield plate 708 can be used to create additional signal exclusion chambers containing additional filter circuit stages. Each additional filter circuit stage performs additional filtering, and additional stages can result in a DC signal with fewer high-frequency components as the final output. In some examples, one of metal shield plate 708 or 710 can be removed to create a two-compartment filter.

As discussed above, limiting thermal gradients and isolating circuit components from external temperature fluctuations can help reduce thermally induced bias and noise. A conductive base plate, such as a copper base plate, can be used to hold circuit components and to distribute heat evenly throughout a signal exclusion enclosure. For example one or more circuit boards can be affixed or otherwise connected to the base plate, and circuit components can be connected to the one or more circuit boards. Insulation can further limit the development of thermal gradients across a base plate that holds the filter components. Aerogels and expanded polystyrene, for example, can be used as insulators. The size and material of the conductive base plate can be determined by conducting a thermal analysis based on user requirements using known techniques.

Component values for the components in FIG. 7 can be selected to make effective filters for the frequency ranges of induction heating power supplies or electrical noise generators. In one example, values for inductors 716, 718, 732, 734, 750, and 752 were chosen to be 3 mH; values for capacitors 724, 736, 738, 740, and 754 were chosen to be 1.0 µF; values for feed-through capacitors 728, 730, 746, and 748 were chosen to be 5000 pF; and neon lamps with a breakdown voltage of approximately 70 V were chosen.

Figure 8:
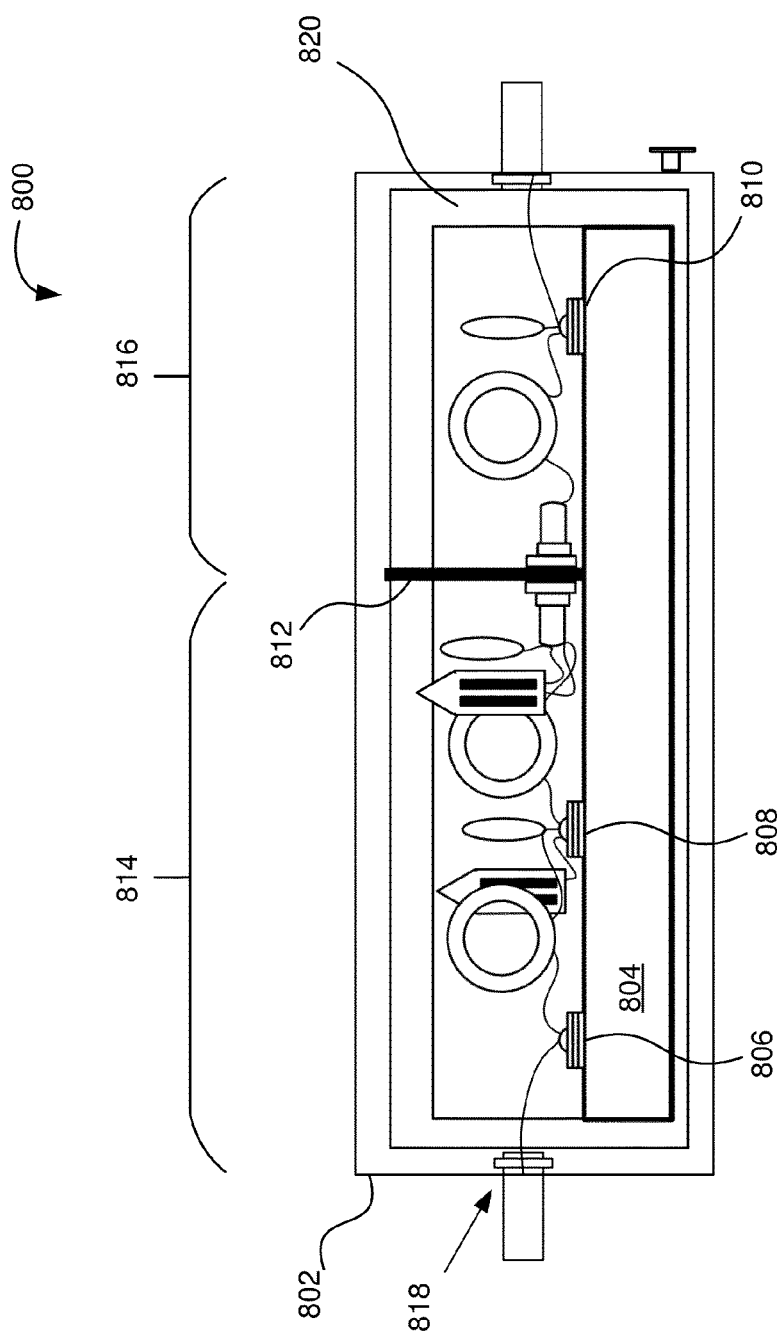
FIG. 8 is a vertical cross-sectional view of an example EMI noise filter having an outer signal exclusion enclosure partitioned into two signal exclusion chambers.
Figure 9:
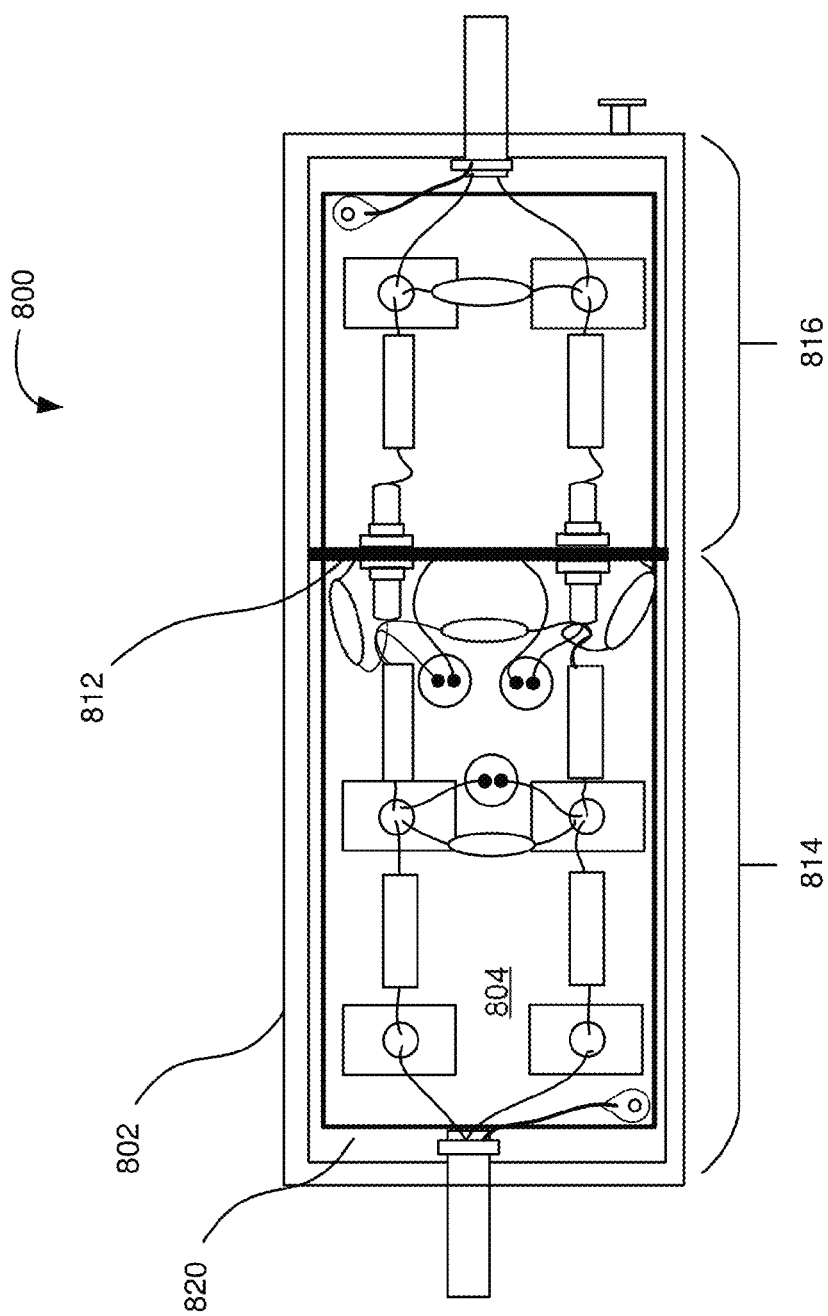
FIG. 9 is illustrates another view of the example EMI noise filter of FIG. 8.

A P-Spice computer simulation of the circuit shown in FIG. 7 with the above values achieved 260 dB of attenuation for frequencies above 300 kHz. Simulation software typically provides a theoretical best case for a simulated circuit. Real-world implementations, however, rarely achieve the theoretical best case because of unmodeled effects such as noise currents. A physical prototype, built without metal shield plate 708, achieved 120 dB of attenuation in testing. A similar prototype is illustrated in FIGS. 8 and 9. The multiple signal exclusion enclosures, thermal management features, and other features of the prototype shown in FIGS. 8 and 9 enhance the performance of the prototype to be much closer to the theoretical best case attenuation than a conventional circuit.

FIG. 8 illustrates a cross section of a prototype EMI noise filter 800 of the circuit shown in FIG. 7 but with metal shield plate 708 omitted. An outer signal exclusion enclosure 802 contains the components of filter 800. Outer signal exclusion enclosure 802 can, for example, be made of aluminum. A conductive base plate 804 is positioned inside outer signal exclusion enclosure 802. Conductive base plate 804 distributes heat within outer signal exclusion enclosure 802. In some examples, conductive base plate 804 is an isothermal copper block. Circuit boards 806, 808, and 810 are connected to conductive base plate 804, for example by using a high-temperature epoxy or other adhesive or soldering.

A conductive partition 812 connects to base plate 804 to create two signal exclusion chambers 814 and 816. In one example, conductive partition 812 is a copper plate 0.063 inches thick. Conductive partition 812 separates a first stage filter circuit, contained within signal exclusion chamber 814, from a second stage filter circuit, contained within signal exclusion chamber 816. An output of the first stage filter circuit passes through conductive partition 812 and is an input to the second stage filter circuit. The first stage filter circuit includes a first plurality of electronic circuit components shown in signal exclusion chamber 814 connected to circuit boards 806 and 808. The first stage filter circuit receives a signal, for example a thermocouple signal, through signal input 818. The second stage filter circuit includes a second plurality of electronic circuit components shown in signal exclusion chamber 816 connected to circuit board 810.

Insulating material 820 is positioned inside outer signal exclusion enclosure 802 and at least partially surrounds the first stage and second stage filter circuits. In some examples, insulation is omitted in one or more locations, such as between conductive base plate 804 and outer signal exclusion enclosure 802.

FIG. 9 illustrates a plan view of the filter 800 shown in FIG. 8 with the top of outer signal exclusion enclosure 802 cut away. The placement of components in signal exclusion chambers 814 and 816 is shown and corresponds to the components shown in FIG. 7 (but with metal shield plate 708 and the corresponding feed-through capacitors omitted).

The example EMI noise filters described herein can be adapted to handle larger current and power levels by using larger components, wiring, and enclosures. Such adapted filters can be appropriate for power supply filtering applications subject to extreme noise, such as pulse width modulation drive motors. The example filters can also be adapted for lower power use or small size requirements. Filter components can also be enclosed using biologically inactive materials for (in situ) use in human, animal, or plant applications.

Example EMI noise filters can be used as power supply filters where either the power supply has periodic noise that requires further reduction or where power distribution networks in which the powered components are RF or EMI generators. Example EMI noise filters can also be adapted for use on 120 VAC or 220 VAC line currents for prevention of eavesdropping techniques. Example filters will stop higher frequency signals from propagating from a device such as computer to an external location where signals can be intercepted for illicit purposes.

Example Computing Environments

Figure 10:
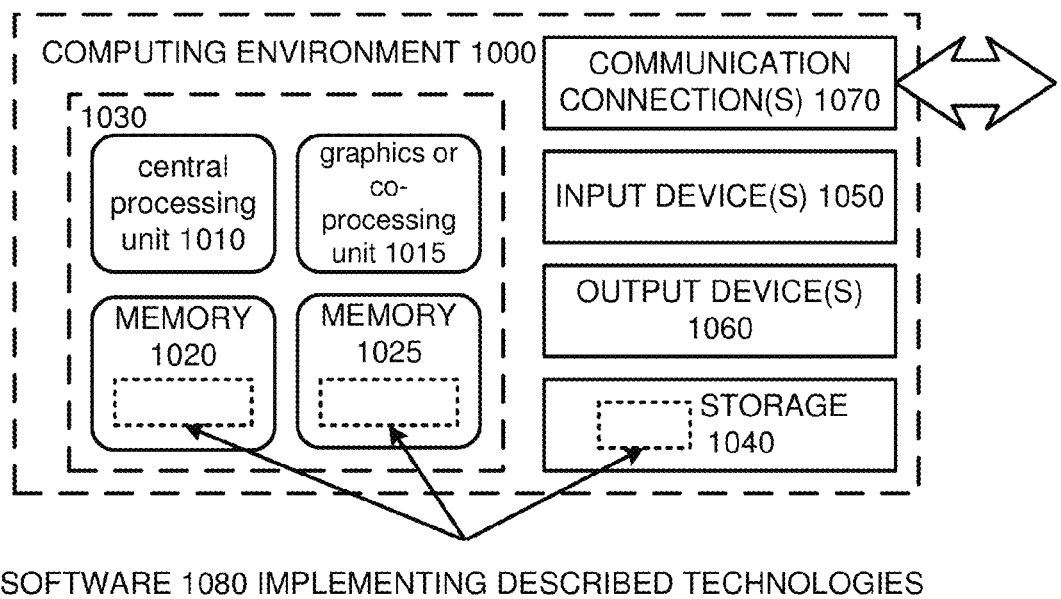
FIG. 10 is a diagram illustrating a generalized example of a suitable computing environment for use with any of the disclosed examples.

FIG. 10 depicts a generalized example of a suitable computing environment 1100 in which the described innovations may be implemented. The computing environment 1100 is not intended to suggest any limitation as to scope of use or functionality, as the innovations may be implemented in diverse general-purpose or special-purpose computing systems. For example, the computing environment 1100 can be any of a variety of computing devices (e.g., desktop computer, laptop computer, server computer, tablet computer, media player, gaming system, mobile device, etc.)

With reference to FIG. 10, the computing environment 1000 includes one or more processing units 1010, 1015 and memory 1020, 1025. In FIG. 10, this basic configuration 1030 is included within a dashed line. The processing units 1010, 1015 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 10 shows a central processing unit 1010 as well as a graphics processing unit or co-processing unit 1015. The tangible memory 1020, 1025 may be volatile memory (e.g., registers, cache, RAM), non-volatile memory (e.g., ROM, EEPROM, flash memory, etc.), or some combination of the two, accessible by the processing unit(s). The memory 1020, 1025 stores software 1080 implementing one or more innovations described herein, in the form of computer-executable instructions suitable for execution by the processing unit(s).

A computing system may have additional features. For example, the computing environment 1000 includes storage 1040, one or more input devices 1050, one or more output devices 1060, and one or more communication connections 1070. An interconnection mechanism (not shown) such as a bus, controller, or network interconnects the components of the computing environment 1000. Typically, operating system software (not shown) provides an operating environment for other software executing in the computing environment 1000, and coordinates activities of the components of the computing environment 1000.

The tangible storage 1040 may be removable or non-removable, and includes magnetic disks, magnetic tapes or cassettes, CD-ROMs, DVDs, or any other medium which can be used to store information in a non-transitory way and which can be accessed within the computing environment 1000. The storage 1040 stores instructions for the software 1080 implementing one or more innovations described herein. For example, processing of output signals filtered by the EMI noise filters described herein can be performed by software 1080. Software 1080 can also control an operating environment, for example induction heaters, in which EMI noise filters are used.

The input device(s) 1050 may be a touch input device such as a keyboard, mouse, pen, or trackball, a voice input device, a scanning device, or another device that provides input to the computing environment 1000. For video encoding, the input device(s) 1050 may be a camera, video card, TV tuner card, or similar device that accepts video input in analog or digital form, or a CD-ROM or CD-RW that reads video samples into the computing environment 1000. The output device(s) 1060 may be a display, printer, speaker, CD-writer, or another device that provides output from the computing environment 1000.

The communication connection(s) 1070 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or nonvolatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that some functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

We claim:

1. An electromagnetic interference noise filter, comprising:
    a first stage filter circuit;
    a second stage filter circuit connected to an output of the first stage filter circuit;
    a conductive base plate, wherein both a circuit board of the first stage filter circuit and a circuit board of the second stage filter circuit are mounted on the conductive base plate, and wherein a thickness of the conductive base plate is selected to distribute heat within the electromagnetic interference noise filter and to limit thermal gradients in the conductive base plate;
    one or more conductive partitions separating the circuit board of the first stage filter circuit from the circuit board of the second stage filter circuit, wherein the output of the first stage filter circuit passes through the one or more conductive partitions to the second stage filter circuit; and
    an outer signal exclusion enclosure containing the first stage filter circuit, the second stage filter circuit, the conductive base plate, and the one or more conductive partitions, wherein a first signal exclusion enclosure containing the first stage filter circuit and a second signal exclusion enclosure containing the second stage filter circuit are formed by the outer signal exclusion enclosure, the one or more conductive partitions, and the conductive baseplate.

2. The noise filter of claim 1, wherein the first and second signal exclusion enclosures are Faraday cages.

3. The noise filter of claim 1, wherein the first and second stage filter circuits each comprise at least one inductor and at least one capacitor.

4. The noise filter of claim 1, wherein the first stage filter circuit comprises a first inductor, a second inductor, a first capacitor, and a second capacitor, wherein the first inductor is connected in series between a first input and a first node, wherein the first capacitor is connected between the first node and ground, wherein the second inductor is connected in series between a second input and a second node, and wherein the second capacitor is connected between the second node and ground.

5. The noise filter of claim 4, wherein the first and second inputs are inputs from a thermocouple, and wherein the noise filter is a thermocouple filter.

6. The noise filter of claim 4, further comprising a gas lamp connected between a first input signal path and a second input signal path, wherein the gas lamp provides overvoltage protection to one or more components in the first stage filter circuit.

7. The noise filter of claim 4, wherein the first stage filter circuit does not comprise (i) a third capacitor connected between the first input and ground or (ii) a fourth capacitor connected between the second signal input and ground.

8. The noise filter of claim 1, wherein the first signal exclusion enclosure attenuates noise generated external to the first signal exclusion enclosure and isolates noise currents generated by the first stage filter circuit.

9. The noise filter of claim 1, wherein the conductive base plate is a copper isothermal block that distributes heat among components of the first and second stage filter circuits.

10. The noise filter of claim 1, further comprising an insulating material positioned inside the outer signal exclusion enclosure, the insulating material acting to maintain a consistent temperature among components of the first and second stage filter circuits.

11. A method of filtering electromagnetic interference noise, the method comprising:
    receiving a first input signal and a second input signal, the first and second input signals forming a differential signal pair;
    in a first signal exclusion enclosure:
        filtering noise generated external to the first signal exclusion enclosure from the differential signal pair using a first pair of low-pass filters, wherein the respective low-pass filters of the first pair comprise an inductor in series with an input to the low-pass filter followed by a capacitor connected between the inductor and ground such that signals from the input that reach the capacitor pass through the inductor;
        filtering noise generated internal to the first signal exclusion enclosure from outputs of the first pair of low-pass filters by providing return paths for noise currents generated by components of the respective low-pass filters of the first pair of low-pass filters; and
        providing a filtered first stage output signal pair; and
    in a second signal exclusion enclosure:
        filtering noise generated external to the second signal exclusion enclosure from the filtered first stage output signal pair using a second pair of low-pass filters;
        filtering noise generated internal to the second signal exclusion enclosure from outputs of the second pair of low-pass filters by providing return paths for noise currents generated by components of the respective low-pass filters of the second pair of low-pass filters; and
        providing a filtered second stage output signal pair, wherein a metal base plate forms a part of the first and second signal exclusion enclosures, wherein both the first pair of low-pass filters and the second pair of low-pass filters are mounted on the metal base plate, and wherein a thickness of the metal base plate is selected to distribute heat within the first and second signal exclusion enclosures and to reduce thermal gradients in the metal base plate.

12. The method of claim 11, further comprising:
    in a third signal exclusion enclosure:
        filtering noise generated external to the third signal exclusion enclosure from the filtered second stage output signal pair using a third pair of low-pass filters;
        filtering noise generated internal to the third signal exclusion enclosure from outputs of the third pair of low-pass filters by providing return paths for noise currents generated by components of the respective low-pass filters of the third pair of low-pass filters; and providing a filtered third stage output signal pair,
wherein the metal base plate forms a part of the third signal exclusion enclosure.

13. The method of claim 11, further comprising: distributing the heat among components of the first pair of low-pass filters and the second pair of low-pass filters using the metal base plate and reducing the thermal gradients in the metal base plate while the internally and externally generated noise in the first and second signal exclusion enclosures is being filtered.

14. An electromagnetic interference noise filter, comprising:
an outer signal exclusion enclosure;
a signal input;
one or more circuit boards contained within the outer signal exclusion enclosure;
a first stage filter circuit having a first plurality of electronic circuit components connected to at least one of the one or more circuit boards, the first stage filter circuit receiving the signal input;
a second stage filter circuit having a second plurality of electronic circuit components connected to at least one of the one or more circuit boards, the second stage filter circuit receiving an output from the first stage filter circuit;
a conductive partition positioned inside, and in physical contact with, the outer signal exclusion enclosure to create at least two signal exclusion chambers, wherein the conductive partition separates the first stage filter circuit, contained within a first chamber of the at least two signal exclusion chambers, from the second stage filter circuit, contained within a second chamber of the at least two signal exclusion chambers, and wherein an output of the first stage filter circuit passes through the conductive partition and is an input to the second stage filter circuit; and
a conductive base plate connected to the conductive partition and positioned inside the outer signal exclusion enclosure, the conductive base plate extending at least partially along the first chamber and the second chamber, wherein the one or more circuit boards are mounted on the conductive base plate, and wherein a thickness of the conductive base plate is selected to distribute heat within the outer signal exclusion enclosure and to limit thermal gradients in the conductive base plate.

15. The noise filter of claim 14, wherein the signal input is a differential input comprising a first signal input and a second signal input, wherein the first plurality of electronic components comprises a first inductor connected at a first terminal of the first inductor to the first signal input and a second inductor connected at a first terminal of the second inductor to the second signal input, and wherein the first plurality of electronic components further comprises a capacitor connected between a second terminal of the first inductor and a second terminal of the second inductor.

16. The noise filter of claim 15, wherein the capacitor is a first capacitor, and wherein the first plurality of electronic components does not comprise (i) a second capacitor connected between the first signal input and ground or (ii) a third capacitor connected between the second signal input and ground.

17. The noise filter of claim 14, wherein the first chamber attenuates noise generated external to the outer signal exclusion enclosure and isolates noise currents generated by the first stage filter circuit, and wherein the second chamber attenuates noise generated external to the outer signal exclusion enclosure and isolates noise currents generated by the second stage filter circuit.

18. The noise filter of claim 14, further comprising an insulating material positioned inside the outer signal exclusion enclosure and at least partially surrounding the first stage and second stage filter circuits.

19. The noise filter of claim 14, wherein the first stage and second stage filter circuits each contain one or more low-pass filters, and wherein the one or more low-pass filters comprise at least one inductor.

20. The noise filter of claim 14, further comprising:
a third stage filter circuit having a third plurality of electronic circuit components connected to at least one of the one or more circuit boards, the third stage filter circuit receiving an output from the second stage filter circuit; and
a second conductive partition connected to the conductive base plate to create at least one additional signal exclusion chamber, wherein the second conductive partition separates the second stage filter circuit, contained within the second chamber, from the third stage filter circuit, contained within the at least one additional signal exclusion chamber, and wherein the output of the second stage filter circuit passes through the second conductive partition and is an input to the third stage filter circuit.

* * * * *